United States Patent

[11] 3,577,138

[72] Inventors Masao Kawashima;
Shunroku Sasaki, Yokohama-shi; Syoichi Kurita, Kawasaki-shi, Japan

[21] Appl. No. 601,467
[22] Filed Dec. 13, 1966
[45] Patented May 4, 1971
[73] Assignee Fujitsu Limited
Kawasaki-shi, Japan
[32] Priority Dec. 16, 1965
[33] Japan
[31] 40/77471

[54] FEEDBACK TYPE PULSE AMPLITUDE MODULATION CODING SYSTEM
8 Claims, 13 Drawing Figs.

[52] U.S. Cl. .......... 340/347
[51] Int. Cl. .......... H03k 13/02
[50] Field of Search .......... 340/347

[56] References Cited

UNITED STATES PATENTS

| | | | |
|---|---|---|---|
| 3,218,630 | 11/1965 | Jankovich | 340/347 |
| 3,351,837 | 11/1967 | Owen | 340/347 |
| 3,414,898 | 12/1968 | Barton | 340/347 |
| 3,348,216 | 10/1967 | Vinson | 340/347 |
| 3,368,149 | 2/1968 | Wasserman | 340/347 |
| 3,438,024 | 4/1969 | Smith | 340/347 |
| 3,439,271 | 4/1969 | Metcalf | 340/347 |
| 3,439,272 | 4/1969 | Bailey | 340/347 |

*Primary Examiner*—Maynard R. Wilbur
*Assistant Examiner*—Jeremiah Glassman
*Attorneys*—Curt M. Avery, Arthur E. Wilfond, Herbert L. Lerner and Daniel J. Tick

ABSTRACT: A pulse amplitude modulated signal is held in a first holding circuit and is supplied to a summing node via a switch. A reference signal from a reference signal source is also supplied to the summing node which provides a difference signal indicative of the difference in amplitude between the pulse amplitude modulated signal and the reference signal. An amplifier amplifies the difference signal and a comparator determines the polarity of the difference signal and provides a corresponding binary output signal. The comparator is also connected to the reference signal source in a first feedback path. A second holding circuit is connected in a second feedback path between the amplifier and the switch and the amplified difference signal is supplied to the summing node via the switch in selective alternation with the pulse signal.

FEEDBACK TYPE PULSE AMPLITUDE MODULATION CODING SYSTEM

The present invention relates to a pulse coding system. More particularly, the invention relates to a feedback-type pulse coding system.

A conventional pulse amplitude modulation coding system may be of countertype parallel comparison type feedback or series comparison type or propagation type. High speed and high precision coding is not readily provided by a counter type coding system, since an extremely high speed of operation is required. It is very expensive to provide high precision coding by a parallel comparison-type coding system, since such system requires the same number of comparison circuits as the steps of quantization.

Although the feedback-type coding system utilizes a simple circuit structure and operates at an intermediate speed, it is very difficult to provide high precision coding with such a system.

The principal object of the present invention is to provide a new and improved pulse coding system. The pulse coding system of the present invention overcomes the disadvantages of known coding systems of various types. The pulse coding system is of feedback type. The pulse coding system provides high speed and high precision coding with accuracy, efficiency, effectiveness and reliability. The pulse coding system of the present invention is of simple structure and is inexpensive in manufacture and operation.

In accordance with the present invention, a coding system for converting a pulse amplitude modulated signal to a binary signal comprises a first circuit for providing a difference signal indicative of the difference in amplitude between a pulse amplitude modulated signal and a reference signal. The first circuit includes a source of the reference signal. An input is connected to the first circuit and supplies a pulse amplitude modulated signal to the first circuit. The input includes a first holding circuit for holding the pulse amplitude modulated signal. A second circuit is connected to the first circuit and to the input and includes a second holding circuit for holding the difference signal provided by the first circuit and for feeding back the held difference signal to the first circuit via the input. An output is connected to the first circuit and determines the polarity of the difference signal provided by the first circuit and provides an indication of such polarity as a binary signal.

The input includes a switch for selectively applying one of the held pulse amplitude modulated signal and the held difference signal to the first circuit. The first circuit includes a summing node having an input connected to the switch, an input connected to the source of reference signal and an output for providing the difference signal. The first circuit further includes an amplifier connected to the output of the summing node. The output includes a comparator connected to the amplifier for determining the polarity of the difference signal provided by the first circuit and an output terminal connected to the comparator for providing an indication of the polarity of the difference signal as a binary signal. The first circuit further includes a first feedback path connecting the comparator to the source of reference signal. The second circuit includes a second feedback path connecting the second holding circuit between the amplifier and the switch.

In a modification of the principal embodiment of the present invention, the output further includes a code converter connected between the comparator and the first feedback path for converting the binary signal provided by the output in accordance with a determined program. The second circuit further includes a full-wave rectifier connected to the amplifier and an ancillary summing node having an input connected to the rectifier, an output connected to the second holding circuit and an input connected to an ancillary voltage source. The rectifier and the ancillary summing node are connected in series in the second feedback path.

In order that the present invention may be readily carried into effect, it will now be described with reference to the accompanying drawings, wherein.

Figure 1:
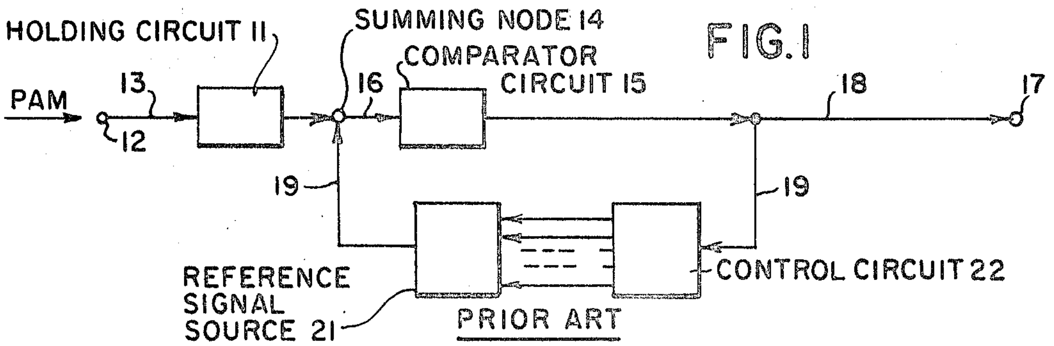
FIG. 1 is a block diagram of an embodiment of a known feedback-type coding system.

In FIG. 1, an amplitude modulated pulse or pulse amplitude modulated signal PAM is applied to a holding circuit 11 via an input terminal 12 and a lead 13. The holding circuit 11 comprises any suitable holding circuit which functions to maintain the amplitude of PAM signal during the coding period. The PAM signal, after it is held in the holding circuit 11, is supplied to an input of a summing node 14. The output of the summing node 14 is connected to the input of a comparator circuit 15 via a lead 16.

The output of the comparator circuit 15 is supplied to an output terminal 17 via a lead 18 and is also supplied to a feedback path 19. A reference signal source 21, which may comprise any suitable source of reference voltage or reference current, has an output connected to an input of the summing node 14 via the feedback path 19. A control circuit 22 is connected in series circuit arrangement with the reference signal source 21 in the feedback path 19; said control circuit having an input connected to the output of the comparator circuit 15 and outputs connected to inputs of said reference signal source. The control circuit 22 controls the operation of the reference signal source 21.

The summing node 14 comprises any suitable arrangement for determining the difference in amplitude between two signals or pulses applied to its inputs. The summing node 14 thus determines the difference in amplitude between the PAM signal and the reference signal provided by the reference signal source 21. The reference signal source 21 thus functions as a decoder. The summing node 14 provides a difference signal equal to the difference in amplitude between the PAM signal and the reference signal, and such difference signal is supplied via the lead 16 to the comparator circuit 15.

The comparator circuit 15 comprises any suitable circuit for determining the polarity or sign of a signal supplied to it and for indicating such polarity or sign. Thus, the comparator circuit 15 determines the polarity or sign of the difference signal supplied to it from the summing node 14 and provides either a binary 1 or a binary 0 signal to the output terminal 17 and to the feedback path 19 in accordance with such polarity. The binary signal provided by the comparator circuit 15 is the code output of the known feedback-type coding system of FIG. 1.

If the comparator circuit 15 determines that the difference signal supplied to it is negative, the control circuit 22 controls the reference signal source 21 to provide a reference signal which is larger in amplitude than the next preceding reference signal by a determined amount. The new reference signal is compared with the PAM signal by the summing node 14 and the operation is repeated, thereby reducing the absolute value of the difference signal.

If the coding system of FIG. 1 is utilized to provide high precision coding, it is necessary to utilize a great number of reference signal amplitudes. The difference signal may be reduced exponentially as the coding operation continues. The limit of the ability of the comparator circuit 15 to determine the polarity of the difference signal, determined by temperature and time variation, is thus exceeded over a wide range of temperature and time.

Figure 2:
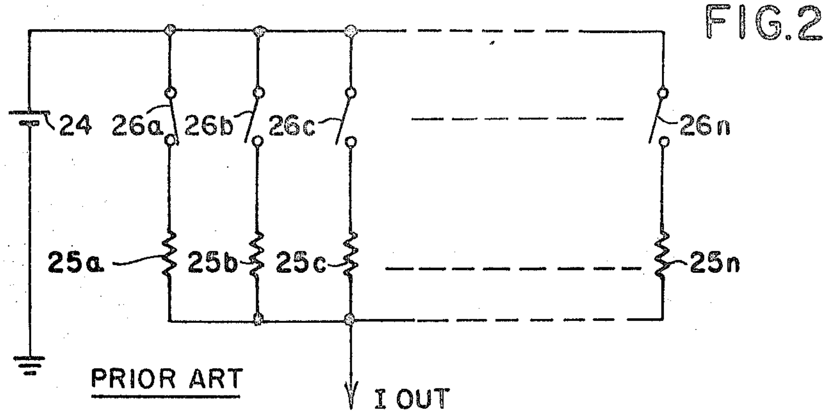
FIG. 2 is a circuit diagram of a reference current source which may be utilized as the reference signal source 21 of FIG. 1.

A known reference current source or decoder of weighting resistor-type which may be utilized as the reference signal source 21 is shown in FIG. 2. The stabilizing current or reference signal source of FIG. 2 comprises a source 24 of stabilizing voltage. Each of the plurality of weighting resistors 25*a*, 25*b*, 25*c*...25*n* is connected in series with a corresponding one of a plurality of switches 26*a*, 26*b*, 26*c*...26*n*. The series connections of weighting resistors 25*a* to *n* and corresponding switches 26*a* to *n* are connected in parallel to the stabilizing voltage source 24.

The number of weighting resistors 25*a—n* and the number of switches 26*a—n* are each equal to the number *n* of digits or bits in the code. Each of the resistors 25*a—n* differs from the next-preceding and the next-succeeding resistors by a factor of $2^n$, where *n* equals 0, 1, 2, 3 and so on. The resistors 25*a—n* must have resistances of extremely high precision in order to provide high precision operation. The switches 26*a—n* are controlled in accordance with the output signal of the comparator circuit 15 (FIG. 1). The output current $I_{out}$ of the reference signal source of FIG. 2 may therefore be expressed as $$I_{\text{out}}=\sum_{n=0}^{n-1} Sn\frac{E}{2^{n+1}}$$

where E is the voltage of the stabilizing voltage source 24 and S*n* is the bit or digit of the binary code or binary number. If the corresponding switch 26*a—n* is open or OFF, the binary bit S*n* is 0. If the corresponding switch 26*a—n* is closed or ON, the binary bit S*n* is 1. The output current $I_{out}$ thus corresponds to the binary number which comprises the bits or digits S0, S1, S2, S3 ... S*n*–1.

In the reference current source of FIG. 2, it is necessary to add one weighting resistor 25*a—n* to increase the code representation by one bit. The ratio of the minimum and the maximum resistance value of the weighting resistor increases exponentially at $2^{n11}$. Thus, if the code representation comprises 10 bits, the ratio of minimum to maximum resistance value is $2^{n11}$ or $2^9$, which is 512. If the minimum resistance value of the weighting resistor is 1 kilohm, the maximum resistance value then becomes 512 kilohms, due to the ratio of 512. Since it is very difficult to produce a high precision resistor having a high resistance value and a high precision resistor having a low resistance value, it is expensive and difficult to provide the circuit of FIG. 2, which utilizes weighting resistors having the wide range of resistance values described.

Figure 3:
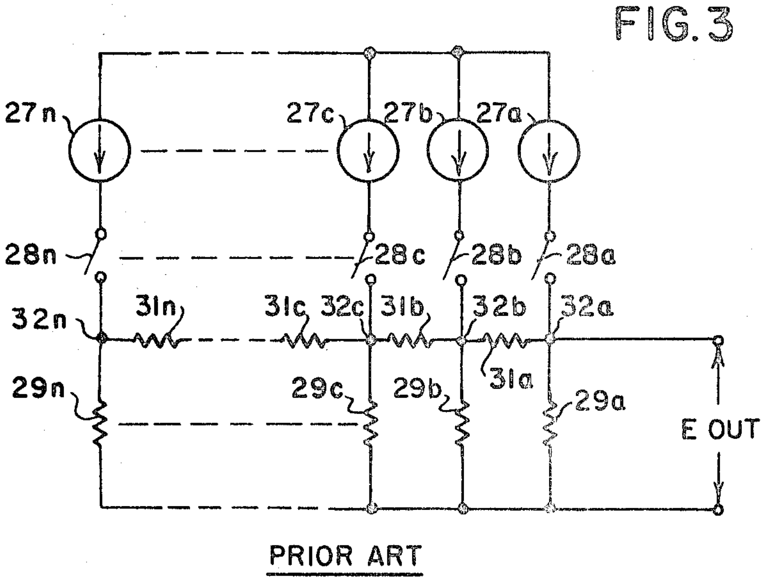
FIG. 3 is a circuit diagram of a reference voltage source which may be utilized as the reference signal source 21 of FIG. 1.

A known reference voltage source or decoder of ladder type which may be utilized as the reference signal source 21 is shown in FIG. 3. The stabilizing voltage or reference signal source of FIG. 3 comprises a plurality of stabilizing current sources 27*a*, 27*b*, 27*c*...27*n*, each of which provides an equal magnitude of current. Each of the current sources 27*a*, 27*b*, 27*c*...27*n* is connected in series circuit arrangement with corresponding one of a plurality of switches 28*a*, 28*b*, 28*c* ... 28*n* and a corresponding one of a plurality of output resistors 29*a*, 29*b*, 29*c*...29*n*. The series circuit arrangements of the current sources 27*a—n*, the switches 28*a—n* and the output resistors 29*a—n* are connected in parallel with each other.

A plurality of coupling resistors 31*a*, 31*b*, 31*c*...31*n* interconnect the series circuit arrangements of the current sources 27*a—n*, the switches 28*a—n* and the output resistors 29*a—n*. Each of the coupling resistors 31*a—n* has an extremely high precision resistance value which is twice that of each of the output resistors 29*a—n*. Each of the coupling resistors 31*a—n* is connected to a corresponding one of the output resistors 29*a—n* at a corresponding one of a plurality of junction or node points 32*a*, 32*b*, 32*c*, ... 32*n*. The switches 28*a—n* are controlled in the same manner as the switches 26*a—n* of FIG. 2. Each of the switches 28*a—n* is connected to a corresponding one of the node points 32*a—n*.

The output voltage $E_{out}$ of the reference signal source of FIG. 3 may be expressed as $$E_{\text{out}}=r\sum_{n=0}^{n-1} Sn\frac{I}{2^{n+1}}$$

where *r* is the resistance value of each of the output resistors 29*a—n* and half the resistance value of each of the coupling resistors 31*a—n*, I is the magnitude of current provided by each of the current sources 27*a—n* and S*n* is the bit or digit of the binary code or binary number. If the corresponding switch 28*a—n* is open, the binary bit S*n* is 0. If the corresponding switch 28*a—n* is closed, the binary bit S*n* is 1. The output voltage $E_{out}$ thus corresponds to the binary number which comprises the bits or digits S0, S1, S2, S3 ... S*n*–1.

In the reference voltage source of FIG. 3, the resistance value does not vary over a wide range, as in FIG. 2, but the intervals in the ladder-type circuit must be increased, as well as the high precision resistors and the stabilizing current sources, so that the circuit of FIG. 3 is very expensive. The insufficiency of the determining ability or operability of the comparator circuit 15 (FIG. 1) when the difference signal is small (FIG. 1) may be remedied by a summing amplifier connected in the input of said comparator circuit. If the gain bandwidth product of the amplifier is constant, high precision coding is provided if the gain is increased, but the frequency bandwidth decreases and high speed operation is impossible. Furthermore, if both the gain and the bandwidth increase, the stability decreases. Therefore, the gain of an amplifier having a stability above a determined extent may not exceed a determined limit. It is thus very difficult to provide a comparator circuit (FIG. 1) of high speed and high precision.

Figures 4, 5:
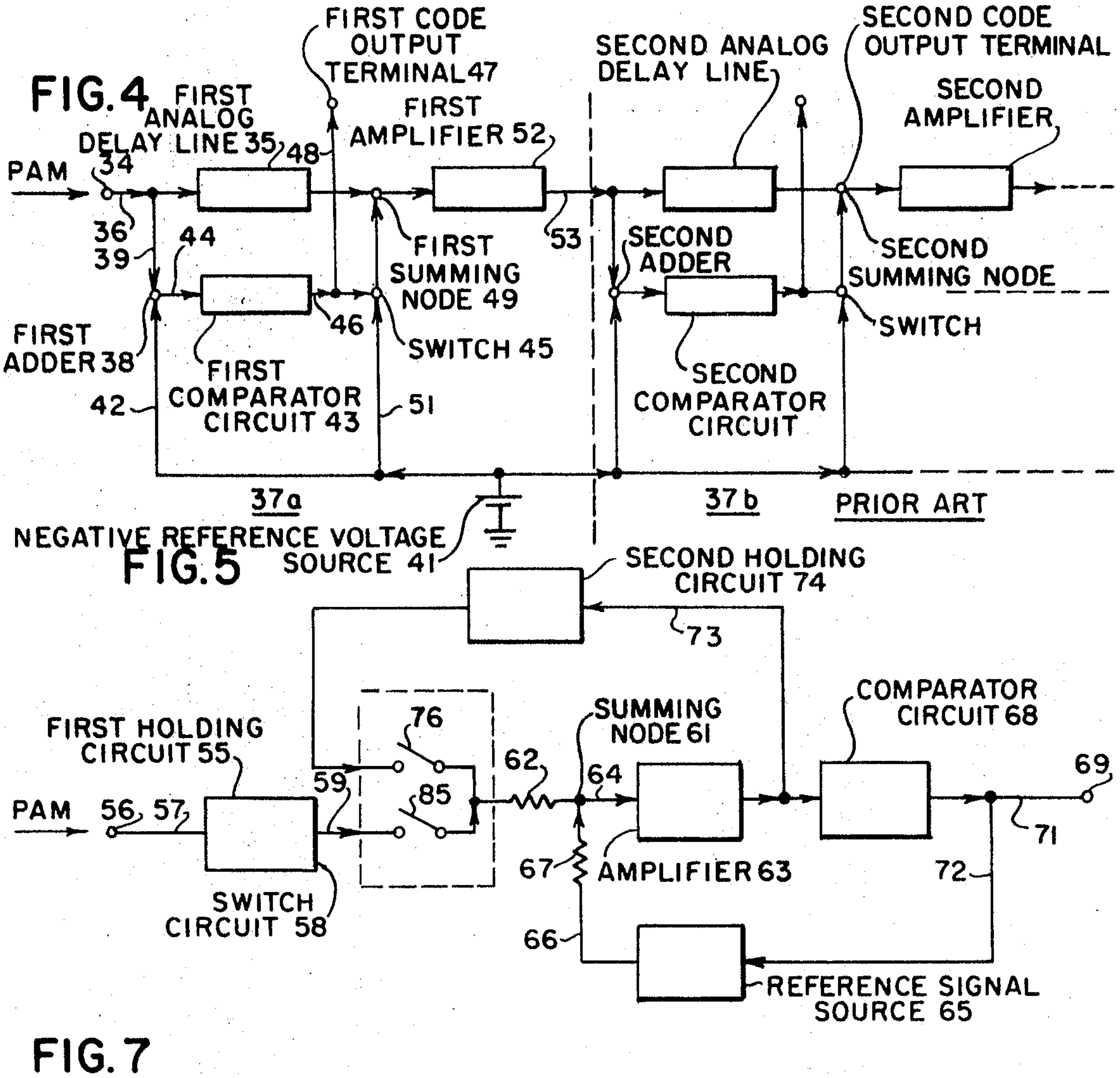
FIG. 4 is a block diagram of an embodiment of a known comparison or propagation-type coding system.
FIG. 5 is a block diagram of an embodiment of the coding system of the present invention.

In FIG. 4, a PAM signal is applied to an input terminal 34 and is supplied to a first analog delay line 35 via a lead 36. The delay line 35 may comprise any suitable delay line. The coding circuit of FIG. 4 comprises a plurality of repetitive, similar stages 37*a*, 37*b*...37*n*. The PAM signal supplied to the input terminal 34 is also supplied to an input of a first adder 38 via a lead 39. The PAM signal is a positive pulse.

The negative reference signal from a negative reference voltage source 41 is applied to an input of the first adder 38 via a lead 42 and the difference signal is provided by said first adder to the input of a first comparator circuit 43 via a lead 44. The first comparator circuit 43 may comprise any suitable comparator circuit for determining the polarity of the difference signal supplied to it by the first adder 38, and the first adder may comprise any suitable arrangement for adding the negative reference signal to the PAM signal and providing a difference signal of the difference in amplitude between such signals. The first comparator circuit 43 determines the polarity of the difference signal and closes a switch 45 connected to its output via a lead 46 when said difference signal is positive.

The output of the first comparator circuit 43 is provided at a first code output terminal 47 via the lead 46 and a lead 48. When the switch 45 is closed or ON, the negative reference signal from the negative reference voltage source 41 is applied to an input of a first summing junction or node 49 via a lead 51 and said switch. The PAM signal, after a determined suitable time delay in the first analog delay line 35, is applied to an input of the first summing node 49 from the output of said first analog delay line.

The first summing node 49 functions to add the negative reference signal to the PAM signal and the difference signal is then amplified by a first amplifier 52. The first amplifier 52 is preferably a 6 decibel amplifier with an amplification factor or gain of 2. The output of the amplifier 52 is then supplied to the next-succeeding stage 37b, which is identical with the first stage 37a, via a lead 53. The output of the stage 37b is supplied to a next-succeeding stage, and so on.

If the first comparator circuit 43 determines that the difference signal is negative, the switch 45 remains open or OFF. In this case, the PAM signal in the first analog delay line 35 is supplied to the first amplifier 52 via the first summing node 49, after the determined time delay, and is doubled in amplitude by said amplifier prior to being supplied to the next-succeeding stage 37b.

There are as many stages 37a, 37b...37n as there are bits or digits in the code and the code indication for each bit is provided at the corresponding code output terminal 47, and so on. The difference signal provided by the summing node 49 is amplified by the amplifier 52 so that it is always in an amplitude range of a specific magnitude. Coding is accomplished by the utilization of a single comparison or reference signal. Since the gain of the amplifier 52 is low, the number of stages 37a, 37b, and so on, must correspond with the number of bits in the code and an increase in speed increases the precision of coding. The coding system of FIG. 4 thus has the disadvantage of requiring more components than the feedback-type coding system.

In known feedback-type coding systems, as the process of feedback comparison proceeds, the level, amplitude or magnitude of the reference or comparison signal approaches the PAM signal level, amplitude or magnitude and the amplitude of the difference signal is reduced. In the coding system of the present invention, however, the coding process is divided into different stages for determined numbers of bits or digits and the difference signal is amplified by an amplifier, which has a suitable amplification factor or gain at a suitable time, and the reference signal source. The number of bits available by properly dividing the coding process is repeatedly utilized. Since the difference signal has a suitable amplitude, the gain of the amplifier need not be too high, and high speed and high precision coding is provided. Since the coding system of the present invention utilizes a plurality of holding circuits, the holding time is reduced and the provision of a suitable holding circuit is facilitated.

The coding system of the present invention may be a five bit coder and is illustrated as such in the embodiment of FIG. 5. In FIG. 5, the PAM signal is applied to a first holding circuit 55 via an input terminal 56 and a lead 57. The first holding circuit 55 may comprise any suitable holding circuit which functions to maintain the amplitude of the PAM signal during the coding period. The PAM signal, after it is held in the holding circuit 55, is supplied to an input of a switch circuit 58 via a lead 59.

A summing node 61 has an input connected to the output of the first holding circuit 55 via the lead 59, the switch circuit 58 and a first resistor 62. The output of the summing node 61 is connected to the input of an amplifier 63 via a lead 64. A reference signal from the output of a reference signal source 65 is supplied to an input of the summing node 61 via a lead 66 and a second resistor 67. The reference signal source 65 may comprise any suitable source of reference voltage or reference current. In this embodiment, the first reference signal is zero, and positive and negative signals are utilized as second and third reference signals. The summing node 61 is a junction or node point between the first and second resistors 62 and 67 at which the PAM signal and the reference signal are added to each other to provide a difference signal which is the difference in amplitude between said signals.

The difference signal provided by the summing node is supplied to the input of the amplifier 63. The amplifier 63 has an amplification factor or gain of 4. The amplifier 63 amplifies the difference signal and supplies the amplified difference signal from its output to the input of a comparator circuit 68 which may comprise any suitable circuit for determining the polarity or sign of a signal supplied to it from the amplifier 63. Thus, the comparator circuit 68 determines the polarity of the difference signal supplied to it from the amplifier 63 and provides either a binary 1 or a binary 0 signal to an output terminal 69 via a lead 71 and to a first feedback path 72 in accordance with such polarity. The binary signal provided by the comparator circuit 68 is the code output of the feedback-type coding system of the present invention.

The amplified difference signal from the amplifier 63 is also supplied to a second feedback path 73 and via said second feedback path to the input of a second holding circuit 74. The second holding circuit 74 is similar to the first holding circuit 55. The output of the second holding circuit 74 is connected to an input of the switch circuit 58.

Figures 6, 11, 12, 13:
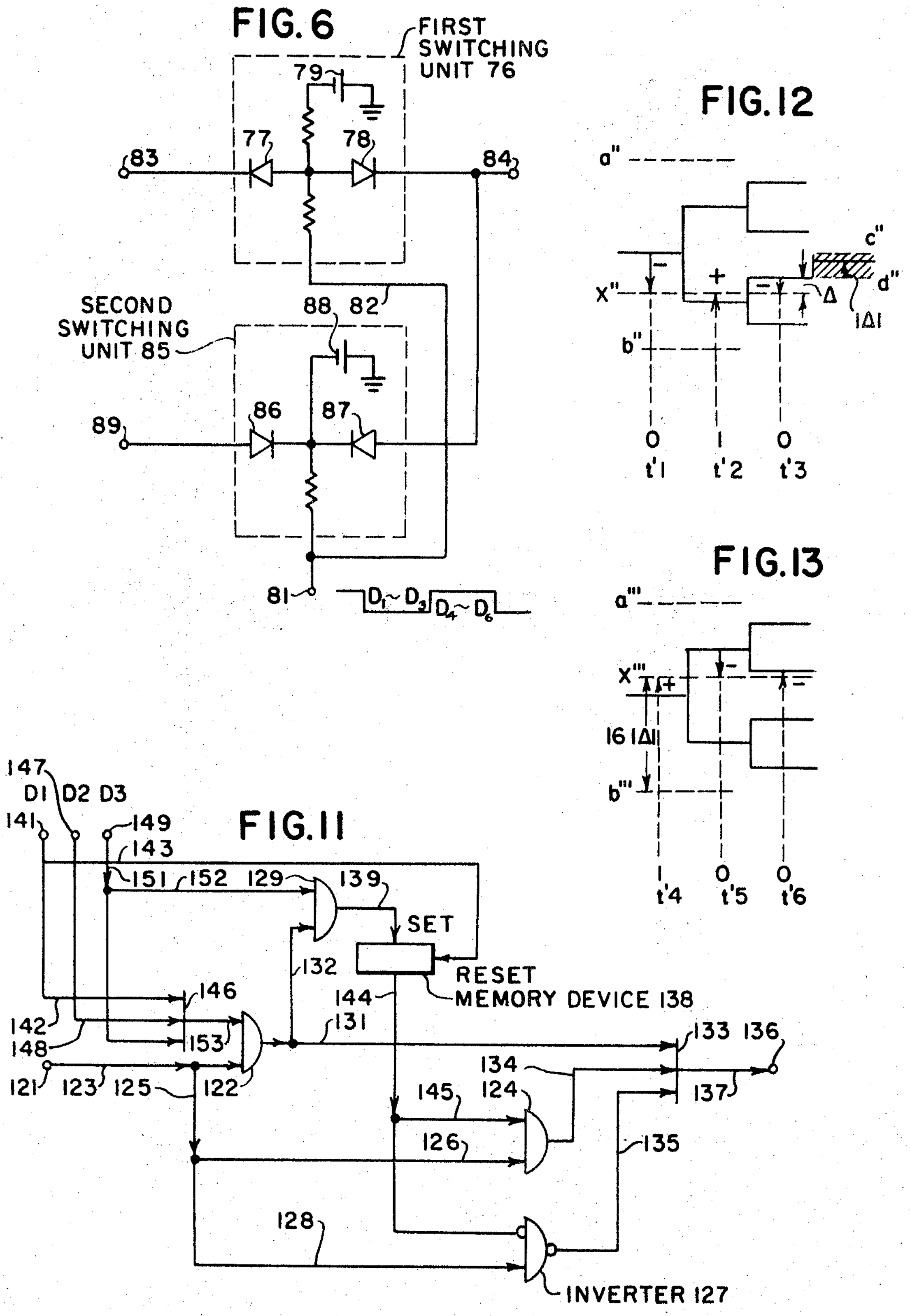
FIG. 6 is a circuit diagram of a switch circuit which may be utilized as the switch circuit 58 of FIG. 5.
FIG. 11 is a circuit diagram of a code converter which may be utilized as the code converter 118 of FIG. 10.
FIG. 12 is a graphical presentation of the coding operation of the coding system of FIG. 10 during a first coding period of the first, second and third bits of the code.
FIG. 13 is a graphical presentation of the coding operation of the coding system of FIG. 10 during a second coding period of the first, second and third bits of the code.

FIG. 6 is a switch circuit which may be utilized as the switch circuit 58 of FIG. 5. In FIG. 6, a first switching unit 76 comprises a first diode 77 and a second diode 78 connected to each other with their anodes in common. A voltage source or battery 79 provides a bias voltage for the diodes 77 and 78. A control signal is supplied to the first switching unit 76 via an input terminal 81 and a lead 82.

In the first switching unit 76, the lead 82 is the negative voltage source and the circuit between an input terminal 83 and an output terminal 84 is closed when a positive pulse is applied to the input terminal 81.

A second switching unit 85 comprises a first diode 86 and a second diode 87 connected to each other with their cathodes in common. A voltage source or battery 88 provides a bias voltage for the diodes 86 and 87. The second switching unit 85 is similar to the first switching unit 76, but has the opposite polarity. The second switching unit 85 extends between an input terminal 89 and the output terminal 84.

As indicated at the input terminal 81, a negative pulse is applied as a control signal to said input terminal during the period of the first, second and third bits or digits of the code. The negative pulse control signal closes or turns ON the second switching unit 85 between the input terminal 89 and the output terminal 84, and opens or turns OFF the first switching unit 76 between the input terminal 83 and the output terminal 84.

A positive pulse is applied as a control signal to the input terminal 81 during the period of the fourth, fifth and sixth bits or digits of the code. The positive pulse control signal opens or turns OFF the second switching unit 85 between the input terminal 89 and the output terminal 84, and closes or turns ON the first switching unit 76 between the input terminal 83 and the output terminal 84.

In the coding system of FIG. 5, therefore, during the coding period of the first, second and third bits, the coding operation is similar to that of a feedback comparison-type coding system, since the second switching unit 85 of the switch circuit 58 is closed or ON and the first switching unit 76 is open or OFF. As graphically illustrated in FIG. 7, which illustrates the coding operation during a first coding period of the coding of the first, second and third bits of the code, when the PAM signal has an amplitude X, the maximum range in which coding is possible is between *a* and *b* during the period of the first, second and third bits of the code. The difference signals of the PAM signals with successive corresponding reference signals are compared in the comparator circuit 68 (FIG. 5) at times *t*1, *t*2 and *t*3. The difference signals at the times *t*1 *t*2 and *t*3 have polarities of negative, positive and positive, respectively, so that the code indication is 0 1 1.

Figure 8:
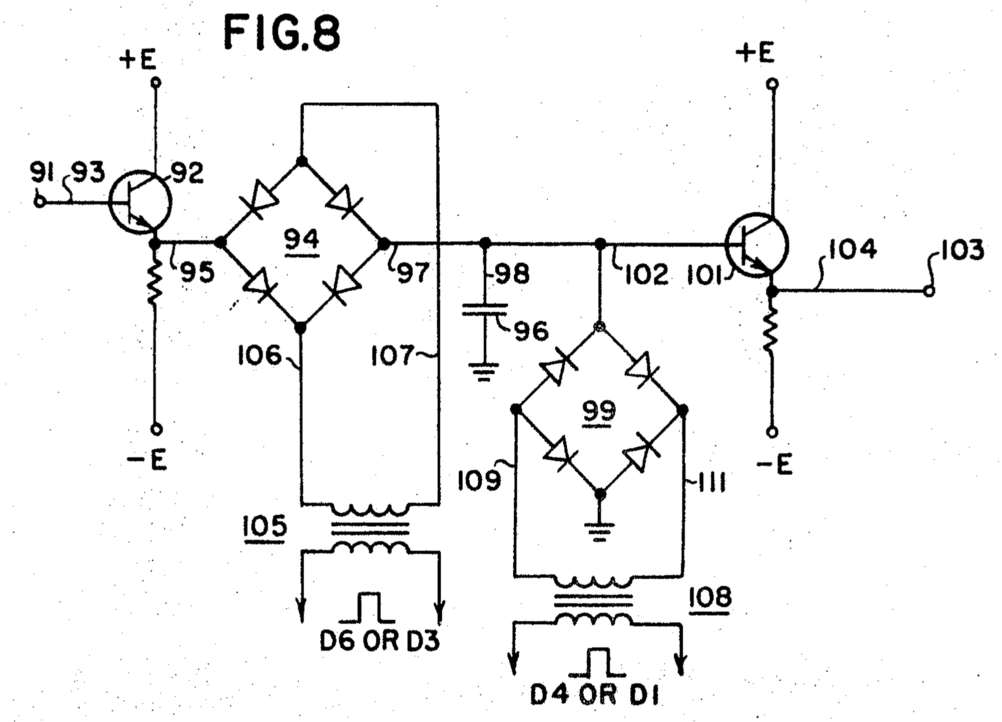
FIG. 8 is a circuit diagram of a holding circuit which may be utilized as the first holding circuit 55 and as the second holding circuit 74 of FIG. 5.

FIG. 8 is a holding circuit which may be utilized as the first holding circuit 55 and as the second holding circuit 74 of FIG. 5. In FIG. 8, an input terminal 91 is connected to the base electrode of an input transistor 92 via a lead 93. The emitter electrode of the input transistor 92 is connected to an output of a first full-wave rectifier 94 via a lead 95. The other output of the first rectifier 94 is connected to a grounded storage capacitor 96 via a lead 97 and a lead 98, to an output of a second full-wave rectifier 99 via the lead 97 and to the base electrode of an output transistor 101 via a lead 102. An output terminal 103 is connected to the emitter electrode of the output transistor 101 via a lead 104.

A positive pulse for the sixth or third bits of the code is supplied to the inputs of the first rectifier 94 via a first transformer 105 and leads 106 and 107. A positive pulse for the fourth or first bits of the code is supplied to the inputs of the second rectifier 99 via a second transformer 108 and leads 109 and 111. The signal to be held is supplied at the input terminal 91 and is derived from the output terminal 103 with the same amplitude.

The input transistor 92 functions as an amplifier which provides a low output impedance to charge the storage capacitor 96 during the short period of time that the first rectifier 94 is operative. The output transistor 101 functions as an amplifier which provides the held signal or voltage at a high input impedance so that the storage capacitor 96 cannot be discharged during the holding time. The second rectifier 99 reduces the voltage of the storage capacitor 96 to zero upon termination of the holding time.

In the coding system of FIG. 5, when the coding of the third digit of the code commences, the first rectifier 94 (FIG. 8) of the second holding circuit 74 is operative and the output of the amplifier 63 (FIG. 5) is supplied to the second holding circuit 74 and such output is stored in the storage capacitor 96 (FIG. 8) during the period from the fourth to the sixth bit of the code. When the coding of the sixth digit of the code commences, the first rectifier 94 (FIG. 8) of the first holding circuit 55 is operative and the storage capacitor 96 (FIG. 8) is charged. The first holding circuit 55 (FIG. 5) thus holds the PAM signal for the period from the first to the third bits. Upon commencement of the coding of the fourth digit, the second rectifier 99 (FIG. 8) is operative and the storage capacitor 96 is discharged.

Figure 7:
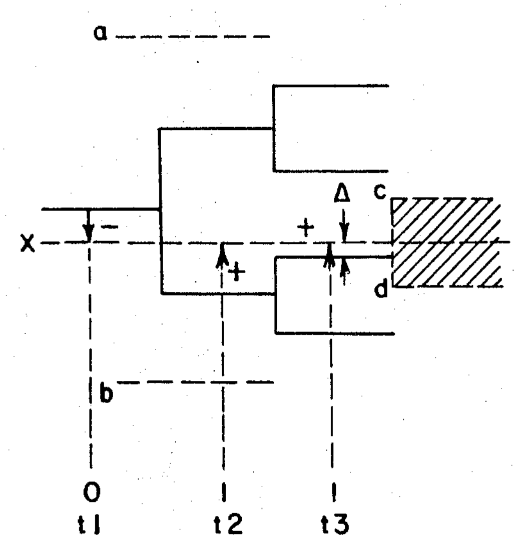
FIG. 7 is a graphical presentation of the coding operation of the coding system of FIG. 5 during a first coding period of the first, second and third bits of the code.
Figure 9:
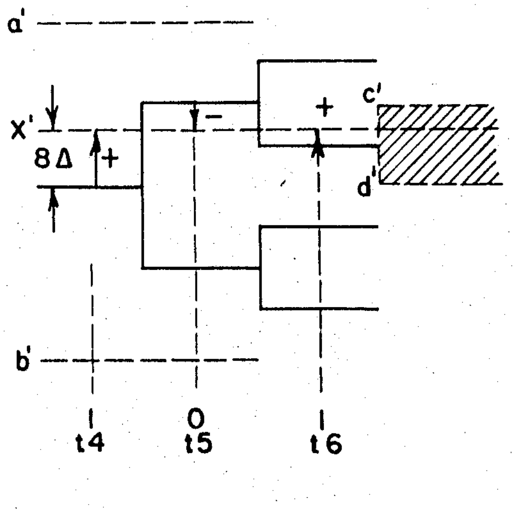
FIG. 9 is a graphical presentation of the coding operation of the coding system of FIG. 5 during a second coding period of the first, second and third bits of the code.

As graphically illustrated in FIG. 9, which illustrates the coding operation during a second coding period of the first, second and third bits of the code, the amplitude of the PAM signal is increased to X′. In FIG. 7, the difference signal is shown by the hatching, and *c*, *d* indicates the range in which the difference is a maximum. Since the signal is amplified, the maximum range, in which the coding operation is accomplished, is extended to the second coding period *a*′ to *b*′ (FIG. 9). The amplified signal is then held. This causes the increase in amplitude of the PAM signal to X′ (FIG. 9).

The signal provided at the output of the second holding circuit 74 is then coded in the same manner as during the former period. As shown in FIGS. 7 and 9, the last bit of one coding period overlaps the first bit of the following coding period. This may be overcome by a memory device connected to the output terminal 69 (FIG. 5). In the coding system of FIG. 5, during the second coding period of the first, second and third bits, the second switching unit 85 of the switch circuit 58 is open or OFF and the first switching unit 76 is closed or ON. The difference signals of the amplified difference signals with successive corresponding reference signals are compared in the comparator circuit 68 (FIG. 5) at times *t4*, *t5* and *t6*. The difference signals at the times *t4*, *t5* and *t6* have polarities of positive, negative and positive, respectively, so that the code indication is 1, 0, 1.

Figure 10:
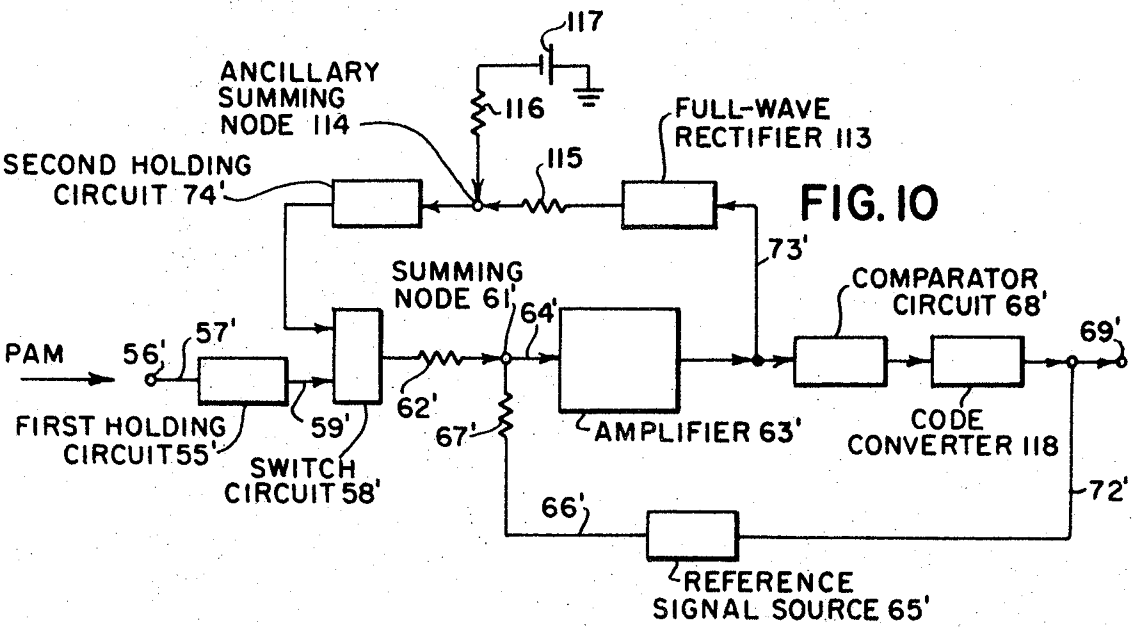
FIG. 10 is a modification of the embodiment of FIG. 5.

In the modification of FIG. 10, the components 56′, 57′, 55′, 59′, 58′, 62′, 61′, 64′, 63′, 68′, 72′, 66′, 67′, 73′, 74′ and 69′ are the same as the components 56, 57, 55, 59, 58, 62, 61, 64, 63, 68, 72, 66, 67, 73, 74 and 69 of the embodiment of FIG. 5, except that the amplification factor or gain of the amplifier 63′ of FIG. 8 is 16, whereas the amplification factor or gain of the amplifier 63 of FIG. 5 is 4. In the modification of FIG. 10, all the reference signals generated by the reference signal source 65′ are unipolar different from the reference signals of the reference signal source 65 of the embodiment of FIG. 5. In the modification of FIG. 10, the input of a full-wave rectifier 113 is connected in the second feedback path 73′ to the output of the amplifier 63′.

An ancillary summing node 114 is provided at the junction or connection point of a pair of resistors 115 and 116. The resistor 115 and the ancillary summing node 114 are connected in series in the second feedback path 73′ between the output of the rectifier 113 and the input of the second holding circuit 74′. The output of the rectifier 113 is connected to an input of the ancillary summing node 114 via the resistor 115. A voltage source or battery 117 applies an ancillary voltage to the other input of the ancillary summing node 114. The output of the ancillary summing node 114 is connected to the input of the second holding circuit 74′.

A code converter 118 has its input connected to the output of the comparator circuit 68′ and its output connected to the output terminal 69′ and to the first feedback path 72′. A code converter which may be utilized as the code converter 118 is shown in FIG. 11. In FIG. 11, an input terminal 121 is connected to the output of the comparator circuit 68′ of FIG. 10. The input terminal 121 is connected to an input of a first AND gate 122 via a lead 123, to an input of a second AND gate 124 via the lead 123, a lead 125 and a lead 126, and to an input of an inverter 127 via the leads 123 and 125 and a lead 128.

The output of the first AND gate 122 is connected to an input of a third AND gate 129 via a lead 131 and a lead 132 and to an input of a first OR gate 133 via the lead 131. The output of the second AND gate 124 is connected to an input of the first OR gate 133 via a lead 134. The output of the inverter 127 is connected to an output of the first OR gate via a lead 135. The output of the first OR gate is connected to an output terminal 136 via a lead 137. The output of the third AND gate 129 is connected to the set input of a memory device 138 via a lead 139.

The first bit of the code is supplied to the reset input of the memory device 138 via an input terminal 141 and a lead 142 and a lead 143. The output of the memory device 138 is connected to an input of the second AND gate 124 via a lead 144 and a lead 145, and to an input of the inverter 137 via the lead 144. The first bit of the code is also supplied to an input of a second OR gate 146 via the lead 142. The second bit of the code is supplied to an input of the second OR gate 146 via an input terminal 147 and a lead 148. The third bit of the code is supplied to an input of the third AND gate 129 via an input terminal 149, a lead 151 and a lead 152, and to an input of the second OR gate 146 via the lead 151. The output of the second OR gate 146 is connected to an input of the first AND gate 122 via a lead 153.

In FIG. 11, during the time that any of the first, second and third bits of the code are supplied to the input terminals 141, 147 and 149, respectively, the second OR gate 146 provides an output signal to the first AND gate 122. Thus, the signal and the input terminal 121 is transmitted by the first AND gate 122 to the first OR gate 133 and the signal is then provided at the output terminal 136. The third bit of the code is stored in the memory device 138, so that the first bit of the code resets said memory device and the third bit is transmitted to the second AND gate 124 and to the inverter 127. If the third bit of the code is a 1, the second AND gate transmits the signal at the input terminal 121 to the first OR gate 133 and the signal is then provided at the output terminal 136. If the third bit is a 0, the inverter 127 inverts it to a 1 and a signal is transmitted to the first OR gate 133 and to the output terminal 136. When none of the first, second and third bits of the code are supplied, such as when the fourth, fifth and sixth bits of the code are provided, there is no output signal from the second OR gate 146 and the first AND gate 122 blocks the signal at the input terminal 121 and prevents it from being transmitted to the output terminal 136.

FIGS. 12 and 13 illustrate the coding operation of the modification of FIG. 10. FIG. 12 illustrates the coding operation during a first coding period of the coding of the first, second and third bits, when the second switching unit 85 (FIG. 5) of the switch circuit 58′ (FIG. 10) is closed and the first switching unit 76 (FIG. 5) is open, and the coding operation is similar to that of the feedback comparison-type coding system. FIG. 13 illustrates the coding operation during a second coding period of the coding of the first, second and third bits, when the second switching unit 85 (FIG. 5) of the switch circuit 58′ (FIG. 10) is open and the first switching unit 76 (FIG. 5) is closed.

When coding commences for the third bit of the code during the first coding period, the second holding circuit 74' (FIG. 10) is operative and the output of the amplifier 63' (FIG. 10), which is the difference signal from the summing node 61' multiplied 16 times in amplitude, is rectified by the full-wave rectifier 113 and the ancillary difference signal between the rectified output signal of said rectifier and the ancillary voltage provided by the battery 117 is provided by the ancillary summing node 114 and is supplied to the second holding circuit 74'.

In FIG. 12 the full-wave rectifier 113 output is indicated by the hatching *c''*, *d''*, which shows the range in which the absolute magnitude of such output is a maximum. The output of the full-wave rectifier 113 is amplified, however, so that the maximum range, in which the coding operation is accomplished, is extended to the second coding period *a'''* to *b'''* (FIG. 13). A specific ancillary voltage is then provided and the amplified, rectified, ancillary difference signal is then held. Unlike the operation of the embodiment of FIG. 5, in the modification of FIG. 10, the reference signal of the first bit in the second coding period is not the same as the reference signal of the third bit in the first coding period, but is an intermediate point between *c''* and *d''* (FIG. 12), which is the reference signal of the fourth bit. The first, second and third bits of the code, during the second coding period, are the fourth, fifth and sixth bits of the code. The amplitude of the output signal of the second holding circuit 74' (FIG. 10) is then increased to X''' (FIG. 13). Then, the signal at the amplitude X''' is coded as in the first coding period by the feedback comparison-type coding system.

In the second coding period, since the inverse code is provided if the difference signal is negative, the absolute magnitude of the difference signal may be coded in the first coding period. Thus, the code outputs in the second coding period must be converted by the code converter 118 of FIGS. 10 and 11, under the control of the third bit of the code in the first coding period, in order to maintain the usual binary code. In FIG. 12, since the third bit of the code during the first coding period is 0, the code output of the second coding period, shown in FIG. 13 to be 1 0 0, is inverted to 0 1 1 and the 6-bit code output of the coding system is 0 1 0 0 1 1.

In the coding system of the present invention, two holding circuits are utilized and the operation is described herein as comprising two coding periods. The operation of the coding system of the present invention is not limited to two coding periods, however, and may comprise more than two coding periods. The coding precision increases with the number of coding periods. If an additional amplifier and holding circuit are utilized, and the additional amplifier and holding circuit are alternately changed over by the switch circuit, there is no need for further amplifier or holding circuits. Furthermore, if a plurality of amplifiers and holding circuits are utilized, and the difference signal is amplified and held prior to the commencement of the next coding period by a time including several bit times, the increase may be kept quite gradual so that the speed of operation may be further increased.

As hereinbefore described, high precision coding may be achieved only by utilizing reference signal levels which adhere to the precision requirements of the code. Thus, when the circuit of FIG. 2 is utilized as the reference signal source in the coding system of the present invention, the ratio of the maximum resistance value of the weighting resistor to the minimum resistance value of the weighting resistor does not become too large, and it is possible to utilize resistors which may be manufactured without difficulty. When the circuit of FIG. 3 is utilized as the reference signal source in the coding system of the present invention, the number of sections of the ladder-type circuit is small, and the circuit may be manufactured without difficulty.

While the invention has been described by means of specific examples and in specific embodiments, we do not wish to be limited thereto, for obvious modifications will occur to those skilled in the art without departing from the spirit and scope of the invention.

We claim:

1. A coding system for converting a pulse amplitude modulated signal to a binary signal, comprising:

first circuit means for providing a difference signal indicative of the difference in amplitude between a pulse amplitude modulated signal and a reference signal, said first circuit means including a source of said reference signal;

input means connected to said first circuit means for supplying a pulse amplitude modulated signal to said first circuit means, said input means including first holding means for holding said pulse amplitude modulated signal;

second circuit means connected to said first circuit means and to said input means and including second holding means for holding the difference signal provided by said first circuit means and for feeding back the held amplified difference signal to said first circuit means via said input means, said input means including switch means for selectively applying one of the held pulse amplitude modulated signal and the held amplified difference signal to said first circuit means in order to provide a coded binary signal; and output means connected to said first circuit means for determining the polarity of the difference signal provided by said first circuit means and for providing an indication of such polarity as a binary signal.

2. A coding system as claimed in claim 1, wherein the switch means of said input means includes electronic switch means.

3. A coding system as claimed in claim 1, wherein said first circuit means includes summing means having an input connected to the switch means of said input means, an input connected to the source of reference signal of said first circuit means and an output for providing said difference signal indicative to the difference in amplitude between said pulse amplitude modulated signal and said reference signal.

4. A coding system as claimed in claim 3, wherein said first circuit means further includes amplifier means connected to the output of said summing means and wherein said output means includes comparator means connected to said amplifier means for determining the polarity of the difference signal provided by said first circuit means and an output connected to said comparator means for providing an indication of the polarity of said difference signal as a binary signal.

5. A coding system as claimed in claim 4, wherein said first circuit means further includes first feedback means connecting said comparator means to the source of reference signal of said first circuit means and wherein said second circuit means includes second feedback means connecting said second holding means between the amplifier means of said first circuit means and the switch means of said input means.

6. A coding system as claimed in claim 5, wherein said output means further includes code converter means connected between the comparator means of said output means and the first feedback means of said first circuit means for converting the binary signal provided by said output means in accordance with a determined program.

7. A coding system as claimed in claim 5, wherein said second circuit means further includes full-wave rectifier means connected to the amplifier means of said first circuit means and ancillary summing means having an input connected to said rectifier means, an output connected to said second holding means and another input, said rectifier means and said ancillary summing means being connected in series in said second feedback means.

8. A coding system as claimed in claim 7, wherein said second circuit means further comprises ancillary voltage means connected to the other input of said ancillary summing means for applying an ancillary voltage to said ancillary summing means.